United States Patent [19]

Hongo

[11] Patent Number: 5,923,838
[45] Date of Patent: Jul. 13, 1999

[54] MICROCOMPUTER WITH BUILT-IN FLASH MEMORY

[75] Inventor: Katsunobu Hongo, Tokyo, Japan

[73] Assignee: Mitsubishi Denki Kabushiki Kaisha, Tokyo, Japan

[21] Appl. No.: 08/835,361

[22] Filed: Apr. 7, 1997

[30] Foreign Application Priority Data

Dec. 17, 1996 [JP] Japan .................................. 8-337345

[51] Int. Cl.[6] .................................................. G06F 11/00
[52] U.S. Cl. ................................. 395/183.18; 395/185.08
[58] Field of Search ....................... 395/183.18, 183.16, 395/182.22, 182.21, 185.08, 185.01, 800.37, 559, 728; 371/62, 21.1, 21.5

[56] References Cited

U.S. PATENT DOCUMENTS

| | | | |
|---|---|---|---|
| 4,079,454 | 3/1978 | Sorenson et al. | 364/200 |
| 4,227,798 | 10/1980 | Steiner | 355/14 C |
| 4,382,279 | 5/1983 | Ugon | 364/200 |
| 4,752,871 | 6/1988 | Sparks et al. | 364/200 |
| 4,807,114 | 2/1989 | Itoh | 364/200 |
| 5,619,452 | 4/1997 | Miyauchi | 365/185.29 |
| 5,719,880 | 2/1998 | Leung | 371/22.5 |
| 5,794,054 | 8/1998 | Le et al. | 395/728 |

*Primary Examiner*—Joseph E. Palys
*Attorney, Agent, or Firm*—Leydig, Voit & Mayer, Ltd.

[57] ABSTRACT

A microcomputer with a flash memory that solves a problem of software overload due to polling during writing or erasing of a flash memory, an interrupt caused by the completion of writing or erasing, or an interrupt caused by a monitor timer. This solution is achieved by suspending the supply of a clock signal from a clock generating circuit to a CPU, and restarting the supply of the clock signal after completion of writing or erasing. This clock signal suspension, in turn, is achieved by providing a NAND gate and an AND gate. The NAND gate NANDs a CPU rewrite mode designating signal and a write/erasure busy signal, both of which are output from a flash control circuit and are kept "1" during writing or erasing of the flash memory, thereby outputting a signal "0" during the writing or erasing. This state fixes the output of the AND gate to "0", which suspends the supply of the clock signal from the clock generator to the CPU.

11 Claims, 8 Drawing Sheets

MICROCOMPUTER WITH BUILT-IN FLASH MEMORY

BACKGROUND OF THE INVENTION

1. Field of the Invention

The present invention relates to a microcomputer with a built-in flash memory.

2. Description of Related Art

Recently, flash memories have rapidly come onto the market. This is because, unlike EPROM (Erasable Programmable Read-Only Memory) requiring ultraviolet light for erasing, erasure as well as writing of data can be easily achieved electrically with flash memories, and hence the once written data can be easily updated.

The microcomputer with a flash memory in place of a mask ROM or EPROM has also been rapidly extending its markets. The flash memories embedded in the microcomputer are used for storing programs or data.

The flash memory installed in the microcomputer can be programmed (written) and erased with a flash memory writer included in a single chip with the flash memory. The flash memory writer, however, cannot write/erase (usually called "rewrite") the flash memory after the microcomputer with the built-in flash memory has been mounted on a circuit board. This is because the flash memory writer carries out the write/erasure of the flash memory while mounting the microcomputer package including the flash memory, and hence cannot write/erase the microcomputer with the built-in flash memory mounted on circuit board.

To solve this problem, a microcomputer with a built-in flash memory which has a CPU rewrite function has been proposed so that the write/erasure of the flash memory in the microcomputer with a built-in flash memory can be achieved even after the microcomputer package has been mounted on the circuit board by using a CPU included therein.

Figure 7:
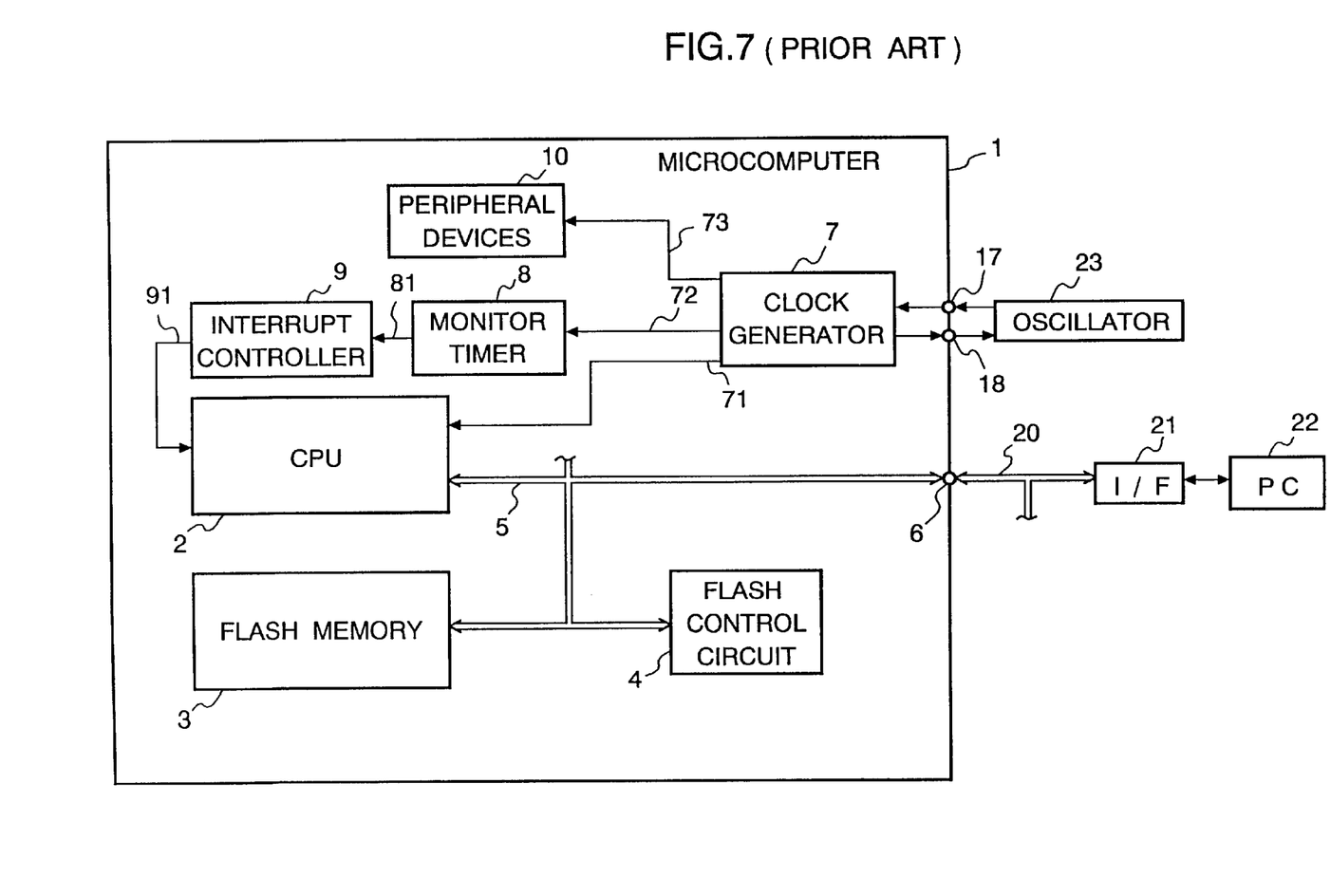
FIG. 7 is a block diagram showing an example of a conventional microcomputer with a built-in flash memory having a CPU rewriting function.

FIG. 7 is a block diagram showing an example of a conventional microcomputer with a built-in flash memory having a CPU rewrite function. In this figure, the reference numeral 1 designates a microcomputer, 2 designates a CPU, 3 designate a flash memory embedded in the microcomputer 1, 4 designates a flash control circuit for carrying out write/erasure of the flash memory 3 by executing a write command or an erasure command issued by the CPU 2, 5 designates a data bus, 6 designates an input/output port as an interface with external devices, 7 designates a clock generator, 8 designates a monitor timer, 9 designates an interrupt controller, 10 designates peripheral devices of the microcomputer 1, 20 designates an external data bus, 22 designates a personal computer (PC) for outputting data to be written in the flash memory 3, 21 designates an interface (I/F) for connecting the external data bus 20 with the personal computer 22, and 23 designates an oscillator.

Figure 8:
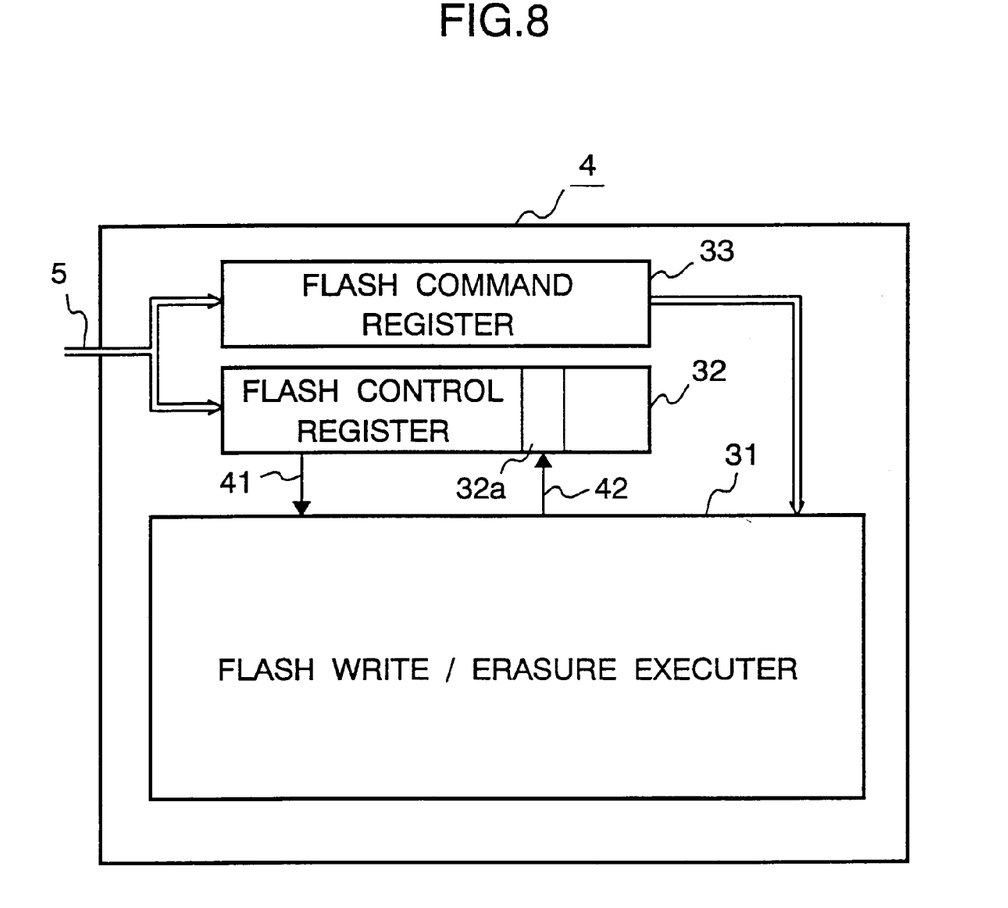
FIG. 8 is a block diagram showing the details of a flash control circuit.

FIG. 8 is a block diagram showing the details of the flash control circuit 4. In this figure, the reference numeral 31 designates a flash write/erasure executer for carrying out write/erasure of the flash memory 3, 32 designates a flash control register for exchanging with the CPU 2 control data for controlling the flash write/erasure executer 31, 32a designates a busy bit which is provided in the flash control register 32 and is referred to as a "CPU rewrite mode designating bit", and 33 designates a flash command register in which the CPU 2 writes a write command or erasure command.

Next, the operation will be described.

The clock generator 7 generates a clock signal 71 for the CPU 2, a clock signal 72 for the monitor timer 8 and a clock signal 73 for the peripheral devices 10 using a clock signal with a fundamental frequency, which is generated by the oscillator 23 and supplied via ports 17 and 18, and supplies the clock signals to the corresponding devices.

The monitor timer 8 receives the clock signal 72, and counts it. In the case where the monitor timer 8 is a count-up type, it outputs an overflow signal 81 to the interrupt controller 9 every time the overflow occurs. On the other hand, when the monitor timer 8 is a count-down type, it outputs an underflow signal to the interrupt controller 9 each time the underflow occurs. For simplicity, it is assumed that the monitor timer 8 is a count-up type in the following description.

Receiving the overflow signal 81 from the monitor timer 8, the interrupt controller 9 generates a monitor timer interrupt request signal 91 to the CPU 2.

The monitor timer 8 is originally provided for detecting the CPU 2 running out of control, in which case the interrupt controller 9 causes the monitor timer interrupt request signal 91 after a predetermined time period has elapsed, and the CPU 2 recognizes by itself that it is running out of control by detecting the monitor timer interrupt request signal 91. Thus, the CPU 2 returns to normal operation by executing interrupt handling associated with the monitor timer interrupt request signal 91.

To achieve the original role of the monitor timer 8, it is preferable that no unnecessary overflow occur. Thus, the CPU 2 resets the monitor timer 8 at intervals within a predetermined time period.

The data writing operation to the flash memory 3 by the CPU 2 will now be described.

The personal computer (PC) 22 suitably supplies the interface (I/F) circuit 21 with data to be written, and the program for writing data to the flash memory 3 using the CPU 2 has been stored in the flash memory 3 itself so that the CPU 2 writes the data to the flash memory 3 by executing the program. In this case, the flash memory 3 includes separate areas for writing data and for storing the program. The area for storing the program can be set to a write disabled state, and the program can be read therefrom even when data is being written to the area for writing data.

Although there is a system which stores the program writing data to the flash memory 3 in a RAM installed in the CPU 2, it is not explained here.

The CPU 2 sets a flag (writes "1", for example) in the CPU rewrite mode, designating bit 32a in the flash control register 32 provided in the flash control circuit 4 as shown in FIG. 8. As a result, the flash control register 32 outputs the CPU rewrite mode designating signal 41 to the flash write/erasure executer 31. Receiving the CPU rewrite mode designating signal 41, the flash write/erasure executer 31 enters the waiting state so that it can execute a command written in the flash command register 33.

When the CPU 2 writes a write command to the flash command register 33 during the waiting state, the flash write/erasure executer 31 decodes the write command, and starts the sequence for writing data to the flash memory 3.

First, the CPU 2 reads the data to be written from the personal computer (PC) 22 via the interface (IF) circuit 21, and transfers the data to the flash memory 3 through the data bus 5. Then, the flash write/erasure executer 31 writes the transferred data into the flash memory 3 in accordance with a predetermined sequence. Although not shown in the drawings, the flash write/erasure executer 31 includes a ring oscillator, a clock generator and a sequencer for generating a clock signal so that procedures for writing data are carried out at respective time intervals by counting the clock signal.

Writing by the flash write/erasure executer 31 is carried out independently of the operation of the CPU 2. This means that the CPU 2 is set free after writing the write command into the flash command register 33, and this makes it possible for the CPU 2 to use its CPU time for other subsequent processing.

The flash write/erasure executer 31 outputs a write/erasure busy signal 42 during the writing The write/erasure busy signal 42 sets to enabled state ("1", for example) the CPU rewrite mode designating bit 32a in the flash control register 32. The CPU 2 can read the CPU rewrite mode designating bit 32a via the data bus 5. The CPU 2 continues to read it during the write processing (called polling), and awaits the CPU rewrite mode designating bit 32a to be disabled (to become "0" in this case) by the completion of the writing.

Confirming that the CPU rewrite mode designating bit 32a is disabled, the CPU 2 verifies whether the data has been written correctly in the flash memory 3. There are two methods for the verification: One verifies the data by directly reading the written data from the flash memory 3, and the other writes a write compare command in the flash command register 33.

After confirming the validity of the data written into the flash memory 3 as a result of the verification, the CPU 2 writes the write command in the flash command register 33 to write the next data.

Next, the erasure of the flash memory 3 by the CPU 2 will be described.

First, the CPU 2 sets a flag in the CPU rewrite mode designating bit 32a in the flash control register 32 provided in the flash control circuit 4, and then writes an erasure command into the flash command register 33. In this case, the flash memory 3 includes separately an area to be erased and an area for storing a program for erasure. The latter area can be set to erasure disabled state, and the program for erasure can be read therefrom even when the former area is being erased.

The flash write/erasure executer 31 decodes the erasure command written into the flash command register 33 and carries out the erasure of the flash memory 3 in accordance with a predetermined sequence.

The flash write/erasure executer 31 outputs the write/erasure busy signal 42 while executing erasing. The write/erasure busy signal 42 sets to enabled state ("1", for example) the CPU rewrite mode designating bit 32a in the flash control register 32. As mentioned above, the CPU 2 can read the CPU rewrite mode designating bit 32a through the data bus 5. Thus, the CPU 2 continues to carry out polling of the CPU rewrite mode designating bit 32a during the erasure interval, and awaits the CPU rewrite mode designating bit 32a to be disabled (to be set to "0" in this case) by the completion of the erasure.

It should be noticed here that the write time and erasure time of the flash memory 3 are much longer than the cycle time of the CPU 2, ranging from 100 to 1000 times the cycle time. This will result in the overflow of the monitor timer 8, causing unnecessary monitor timer interrupts. To prevent this, the CPU 2 must reset the monitor timer 8 within a certain time interval.

Since the monitor timer 8 is originally provided for detecting the CPU 2 running out of control, it is not preferable for the unnecessary overflow to occur. Since the writing or erasure of the flash memory 3, however, causes overflow of the monitor timer 8, it must be reset more frequently than usual, which results in overloading of software.

In the foregoing example, the CPU 2 detects the completion of the writing or erasure of the flash memory 3 by continuously polling the CPU rewrite mode designating bit 32a during the writing or erasure. This method, however, does not enable the CPU 2 to stand by. That is, the CPU 2 cannot handle other processes because most of the CPU time is used for the polling.

It is necessary to remove the polling to enable the CPU 2 to stand by. To achieve this, the flash write/erasure executer 31 can request the interrupt controller 9 to generate an interrupt request when the writing or erasure of the flash memory 3 has been completed, so that the completion is indicated to the CPU 2 by means of interrupt.

In the foregoing example, it is assumed that the flash memory 3 includes separate areas for write/erasure and the area for storing the program for write/erasure, and the write/erasure program can be read out of the latter area even during the writing/erasing. Some microcomputers with a built-in flash memory, however, have a flash memory which inhibits reading the area for storing the writing/erasing program during writing/erasing, even though their flash memories are separated into the area for the writing/erasing and the area for storing the writing/erasing program so that an area can be established in which the data cannot be written. Since the writing/erasing program cannot be read during the writing/erasing in this case, it is necessary for such microcomputers to transfer the writing/erasing program to a RAM before carrying out the writing/erasing so that the writing/erasing of the flash memory 3 is performed by the writing/erasing program stored in the RAM.

In summary, the conventional microcomputers with a built-in flash memory with the foregoing configurations have the following problems.
(1) The CPU must continue polling for detecting the completion of writing or erasing or erasure throughout writing or erasing or erasure of the flash memory, and hence the polling results in the overload of the software.
(2) If the method using the interrupt to inform the CPU of the completion of the writing or erasure is employed instead of the polling, CPU time is consumed to execute the interrupt handler.
(3) It is necessary for the CPU to frequently reset the monitor timer at predetermined intervals to prevent the overflow of the monitor timer due to the writing or erasure of the flash memory. This requires an instruction for resetting the monitor timer to be inserted at various places of the program, which results in the overload in a control software. In addition, this requires considerable time for checking whether the reset instruction of the monitor timer is suitably placed, which will retard the development of the software.
(4) It is necessary for the microcomputer with a built-in flash memory, in which reading from the program area is inhibited during writing/erasing of the flash memory, to transfer the writing/erasing program to the RAM so that writing/erasing is executed according to the program written in the RAM. This results in an increase of the load on the software. In addition, since the capacity of the RAM (usually a few percent of the capacity of the ROM) imposes restrictions on the program, the writing/erasing program with a scale sufficient for implementing detailed algorithm cannot be installed.

SUMMARY OF THE INVENTION

It is therefore an object of the present invention to provide a microcomputer with a built-in flash memory that can reduce the load of software during write and erasure operations, thereby solving the foregoing problems.

In a microcomputer with a built-in flash memory in accordance with a first aspect of the present invention, supply of a clock signal from clock generating means to a CPU is suspended during write or erasure operation of a flash memory in response to a signal output from a flash control circuit for carrying out write or erasure of the flash memory by executing a write or erasure command issued by the CPU.

In a microcomputer with a built-in flash memory in accordance with a second aspect of the present invention, supply of a clock signal from clock generating means to a monitor timer is suspended during write or erasure operation of a flash memory in response to a signal output from a flash control circuit for carrying out write or erasure of the flash memory by executing a write or erasure command issued by the CPU.

In a microcomputer with a built-in flash memory in accordance with a third aspect of the present invention, supply of a clock signal from clock generating means to a CPU and a monitor timer is suspended during write or erasure operation of a flash memory in response to a signal output from a flash control circuit for carrying out write or erasure of the flash memory by executing a write or erasure command issued by the CPU.

Here, the microcomputer with the built-in flash memory may further comprise an erasing error flag register which is set by an erasing error signal output from the flash control circuit if an error occurs while erasing the flash memory.

The microcomputer with the built-in flash memory may further comprise: busy signal output enable bit holding means for holding a bit that decides whether to output a state of the flash control circuit or not; and a port input/output control circuit for carrying out control of a test and input/output port in such a manner it is used as the test port or as the general purpose input/output port depending on the bit held in the busy signal output enable bit holding means.

The CPU clock control means may comprise a NAND gate which NANDs a CPU rewrite mode designating signal and a write/erasure busy signal, both of which are output from the flash control circuit and are kept "1" during the one of write and erasure of the flash memory, and an AND gate which ANDs the clock signal and the output of the NAND gate.

DETAILED DESCRIPTION OF THE PREFERRED EMBODIMENTS

The invention will now be described with reference to the accompanying drawings.

EMBODIMENT 1

Figure 1:
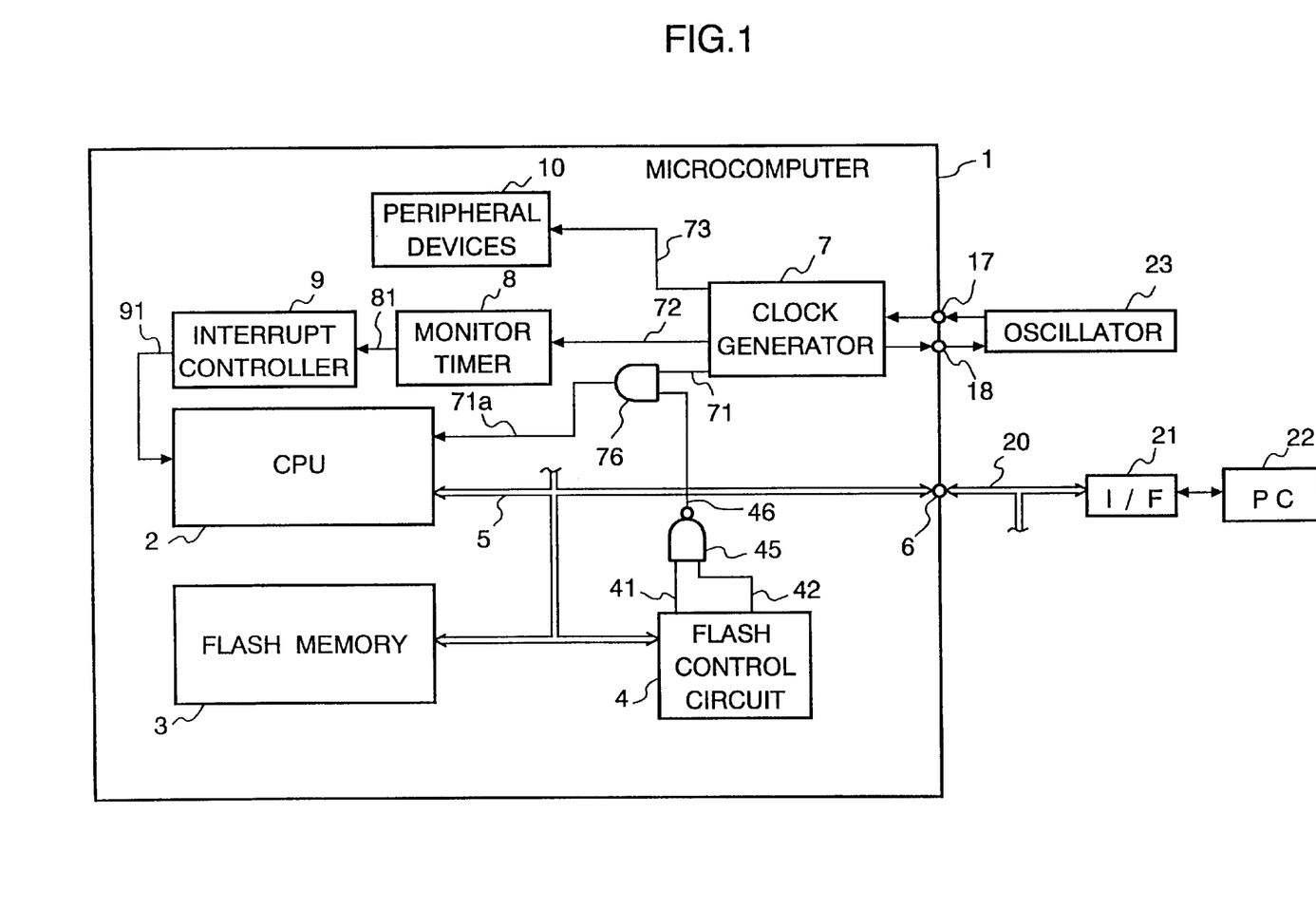
FIG. 1 is a block diagram showing an embodiment 1 of a microcomputer with a built-in flash memory in accordance with the present invention.

FIG. 1 is a block diagram showing an embodiment 1 of a microcomputer with a built-in flash memory in accordance with the present invention. In FIG. 1, the reference numeral 1 designates a microcomputer, 2 designates a CPU, 3 designates a flash memory embedded in the microcomputer 1, 4 designates a flash control circuit for carrying out writing or erasing of the flash memory 3 by executing a write command or an erasure command issued by the CPU 2, 5 designates a data bus, 6 designates an input/output port as an interface between the data bus 5 and an external, 7 designates a clock generator (clock generating means), 8 designates a monitor timer, 9 designates an interrupt controller, 10 designates peripheral devices of the microcomputer 1, such as a timer, serial I/O, A/D converter, 20 designates an external data bus, 21 designates an interface (I/F) circuit connecting the external data bus 20 to a personal computer 22 which outputs data to be written in the flash memory 3, and 23 designates an oscillator (clock generating means), such as a ceramic oscillator or crystal oscillator.

The reference numeral 45 designates a NAND gate for NANDing a CPU rewrite mode designating signal 41 and a write/erasure busy signal 42, 76 designates an AND gate (CPU clock control means) for ANDing a clock signal 71 for the CPU 2 generated by the clock generator 7 and an output signal 46 of the NAND gate 45.

Next, the operation of the embodiment 1 will be described.

The contents of the flash control circuit 4 of the present embodiment 1 are the same as those shown in FIG. 8. Specifically, the CPU 2 writes "1" to the CPU rewrite mode designating bit 32a in the flash control register 32 before starting the write or erasure operation of the flash memory 3. By this, the CPU rewrite mode designating signal 41 is set to "1". The flash write/erasure executer 31, receiving the CPU rewrite mode designating signal 41, outputs the write/erasure busy signal 42. Since both the CPU rewrite mode designating signal 41 and write/erasure busy signal 42 output from the flash control circuit 4 during writing or erasing of the flash memory 3 are "1", the output signal 46 of the NAND gate 45 becomes "0". Thus, an output 71a of the AND gate 76 is fixed at "0", which prevents the clock signal from being supplied to the CPU 2.

When the writing or erasure of the flash memory 3 has been completed, the write/erasure busy signal 42 falls to "0", and hence the output signal 46 of the NAND gate 45 rises to "1". This sets to "1" the output 71a of the AND gate 76, which causes the clock signal to be supplied again to the CPU 2.

According to the embodiment 1, the operation of the CPU 2 is automatically suspended during the write or erasure operation of the flash memory 3 by preventing the clock signal from being supplied to the CPU 2. The operation of the CPU is then automatically restarted after the completion of the writing or erasure operation by resupplying the clock signal to the CPU 2. Accordingly, the CPU 2 can proceed to the next write comparison operation without carrying out polling after writing data to the flash memory 3.

According to the embodiment 1, no program for polling is necessary because the completion of the writing or erasure of the flash memory can be detected without polling. In addition, since the write/erasure interrupt becomes unnecessary, the hardware and handler for the interrupt can be removed. This feature makes it possible to reduce the load on the software during the writing and erasure of the flash memory.

Moreover, it offers no problem even if the microcomputer with a built-in flash memory cannot read the region outside the write/erasure area of the flash memory during the writing or erasure, because the CPU is inactivated during the write/erasure operation, and hence the CPU does not read the write/erasure program. This makes it possible to eliminate operations like transferring the writing/erasure program to the RAM.

EMBODIMENT 2

Figure 2:
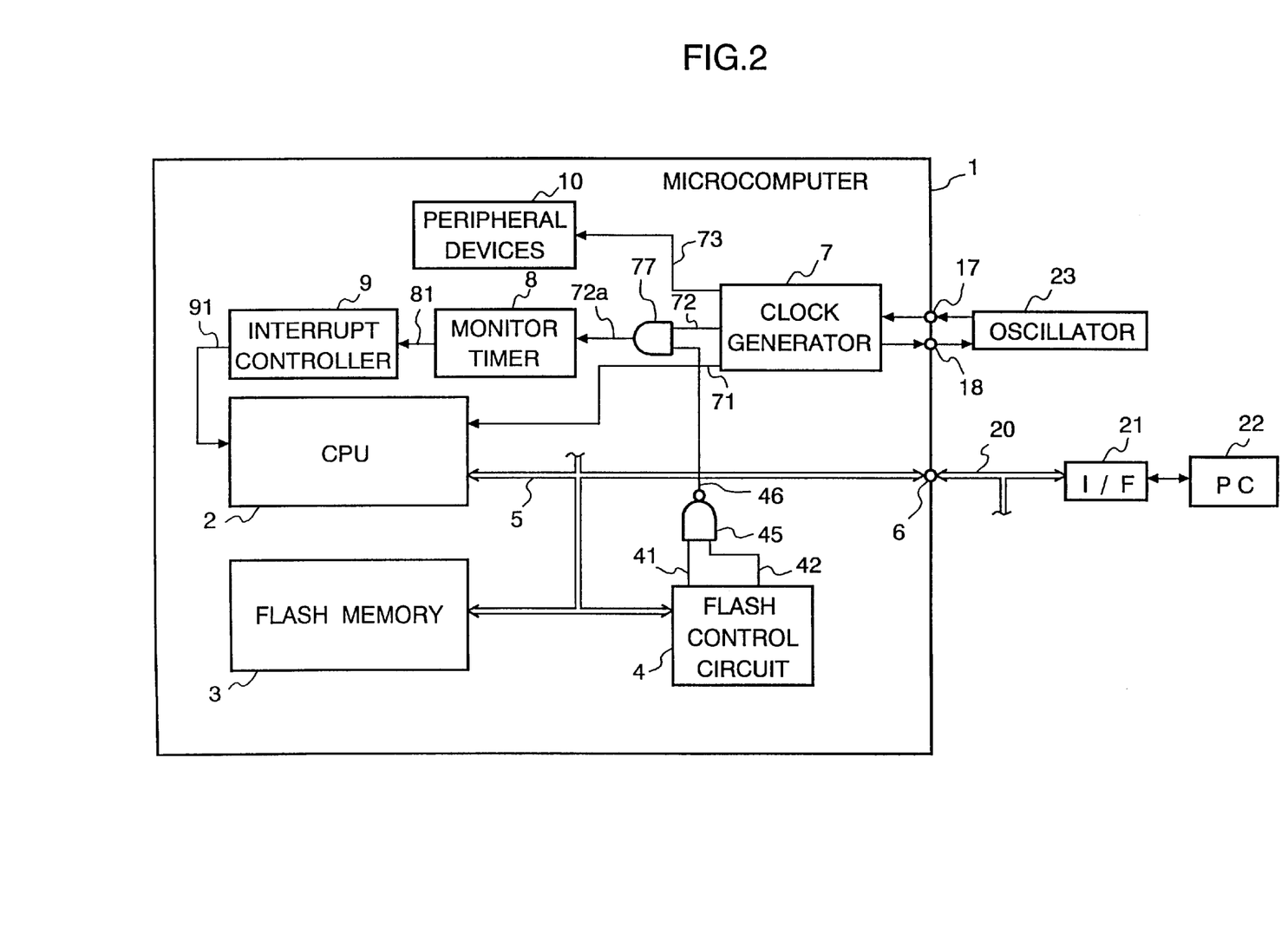
FIG. 2 is a block diagram showing an embodiment 2 of the microcomputer with a built-in flash memory in accordance with the present invention.

FIG. 2 is a block diagram showing an embodiment 2 of a microcomputer with a built-in flash memory in accordance with the present invention. In FIG. 2, the same or like portions to those in FIG. 1 are designated by the same reference numerals and the description thereof is omitted here.

The reference numeral 77 designates an AND gate (monitor timer clock control means) for ANDing a clock signal 72 for the monitor timer 8 generated by the clock generator 7 and the output signal 46 of the NAND gate 45.

Next, the operation of the embodiment 2 will be described.

Since both the CPU rewrite mode designating signal 41 and write/erasure busy signal 42 output from the flash control circuit 4 during write or erasure operation of the flash memory 3 are "1", the output signal 46 of the NAND gate 45 becomes "0". Thus, an output 72a of the AND gate 77 is fixed at "0", which prevents the clock signal from being supplied to the monitor timer 8.

When the writing or erasure of the flash memory 3 has been completed, the write/erasure busy signal 42 falls to "0", and hence the output signal 46 of the NAND gate 45 rises to "1". This sets to "1" the output 72a of the AND gate 77, which causes the clock signal to be supplied again to the monitor timer 8.

Since the embodiment 2 operates in this way, the monitor timer 8 automatically suspends its counting during the write or erasure operation of the flash memory 3 by preventing the clock signal from being supplied to the monitor timer 8. The monitor timer 8 automatically restarts the counting after the completion of writing or erasure by recovering the supply of the clock signal to the monitor timer 8.

According to the embodiment 2, since the counting of the monitor timer 8 is greatly retarded as compared with the conventional one, the number of resets of the monitor timer 8 by the CPU 2 can be greatly reduced. This makes it possible to reduce the load on the software during writing or erasure of the flash memory.

EMBODIMENT 3

Figure 3:
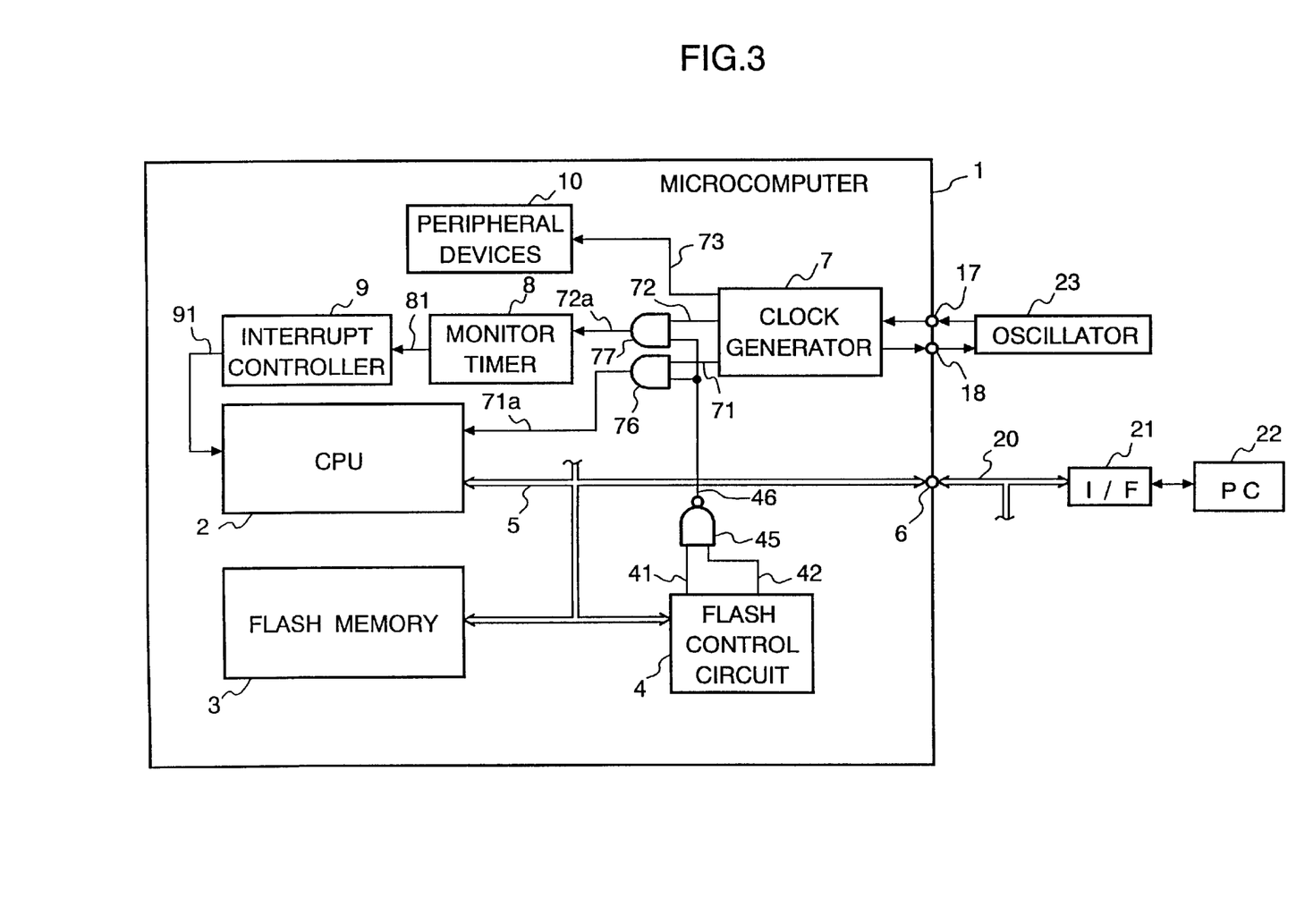
FIG. 3 is a block diagram showing an embodiment 3 of the microcomputer with a built-in flash memory in accordance with the present invention.

FIG. 3 is a block diagram showing an embodiment 3 of the microcomputer with a built-in flash memory in accordance with the present invention. In FIG. 3, the same or like portions to those in FIGS. 1 and 2 are designated by the same reference numerals and the description thereof is omitted here.

Next, the operation of the embodiment 3 will be described.

Since both the CPU rewrite mode designating signal 41 and write/erasure busy signal 42 output by the flash control circuit 4 during the write or erasure operation of the flash memory 3 are "1", the output signal 46 of the NAND gate 45 becomes "0". Thus, the output 71a of the AND gate 76 and the output 72a of the AND gate 77 are fixed at "0", which prevents the clock signals 71 and 72 from being supplied to the CPU 2 and monitor timer 8.

When the writing or erasure of the flash memory 3 has been completed, the write/erasure busy signal 42 falls to "0", and hence the output signal 46 of the NAND gate 45 rises to "1". This opens the AND gates 76 and 77, which allows the clock signals 71 and 72 to be supplied again to the CPU 2 and monitor timer 8.

Since the embodiment 3 operates in this way, the operation of the CPU 2 and the counting of the monitor timer 8 are automatically suspended during the writing or erasure of the flash memory 3 by inhibiting the clock signals from being supplied to the CPU 2 and monitor timer 8, and are automatically restarted after the completion of writing or erasure by resupplying of the clock signals.

According to the embodiment 3, no program for polling is needed because the polling is not required for detecting the completion of writing or erasure of the flash memory. In addition, since the writing/erasure interrupt is obviated, no hardware and handler for the interrupt are needed. Moreover, since the counting by the monitor timer 8 is greatly retarded as compared with the conventional one, the number of resets of the monitor timer 8 by the CPU 2 can be greatly reduced. This makes it possible to reduce the load on the software during writing or erasure of the flash memory.

EMBODIMENT 4

Figure 4:
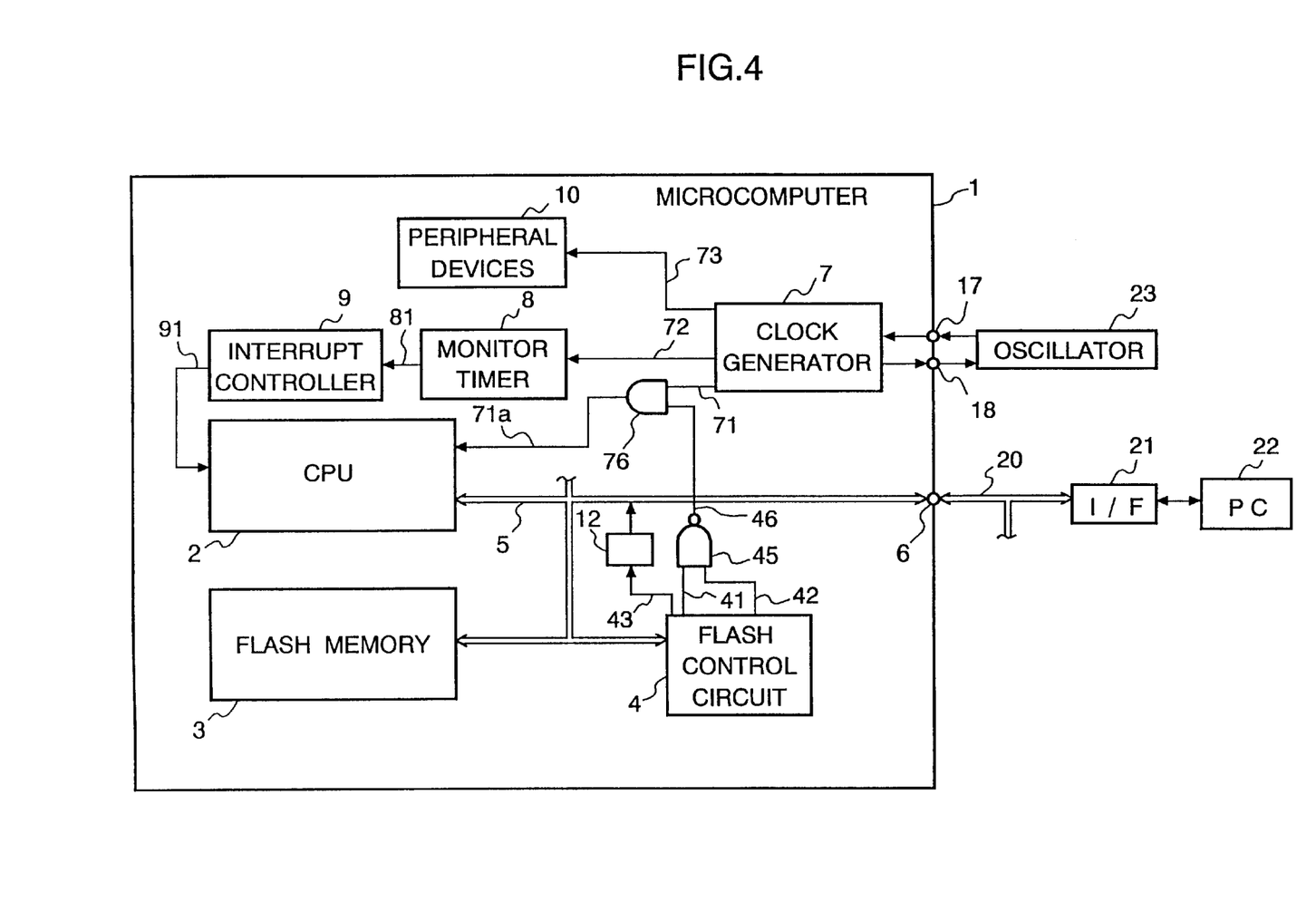
FIG. 4 is a block diagram showing an embodiment 4 of the microcomputer with a built-in flash memory in accordance with the present invention.

FIG. 4 is a block diagram showing an embodiment 4 of the microcomputer with a built-in flash memory in accordance with the present invention. In FIG. 4, the same or like portions to those in FIG. 1 are designated by the same reference numerals and the description thereof is omitted here.

The reference numeral 43 designates an erasing error signal generated by the flash write/erasure executer 31 (see, FIG. 8) provided in the flash control circuit 4. The erasing error signal 43 is made active by the occurrence of an erasing error such as noncompletion of the erasure operation within a predetermined time period.

The reference numeral 12 designates an erasing error flag register which is set by the erasing error signal 43 and reset by a read operation from the CPU 2.

Figure 5:
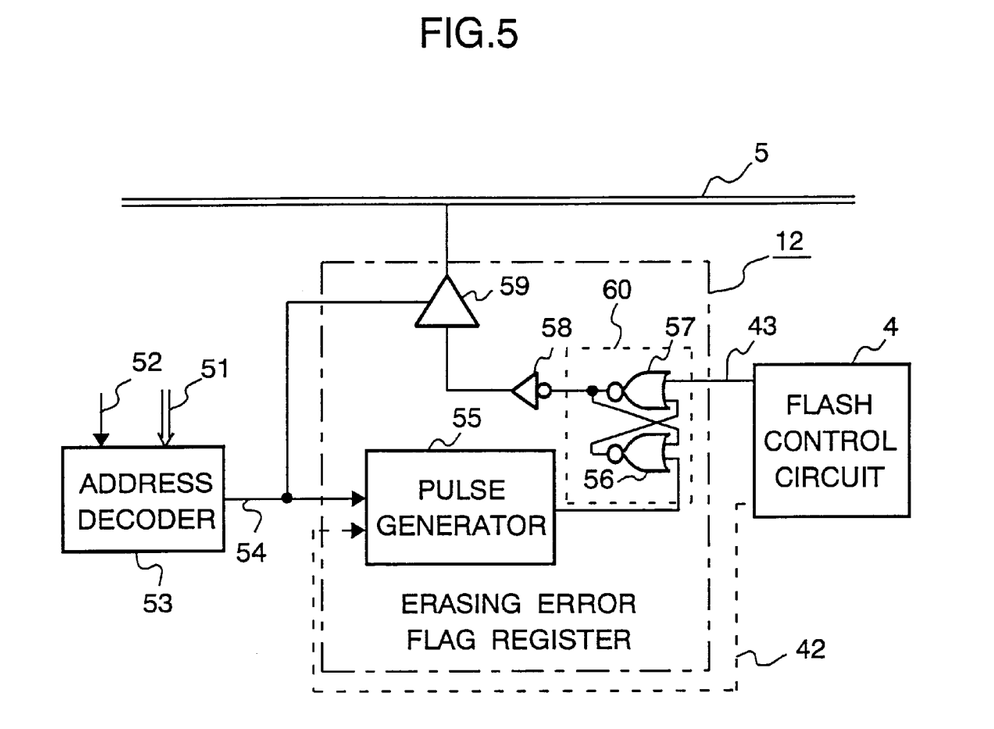
FIG. 5 is a block diagram showing the details of an erasing error flag register of embodiment 4.

FIG. 5 is a block diagram showing the details of the erasing error flag register 12. In this figure, the reference numeral 51 designates an address signal output from the CPU 2, 52 designates a read signal output from the CPU 2, 53 designates an address decoder for decoding the address signal 51 output from the CPU 2, 55 designates a pulse generator for generating a one-shot pulse immediately after a read signal 54 output from the address decoder 53 changes from active to inactive, 56 and 57 each designate a NOR gate constituting a flip-flop 60, 58 designates an inverter, and 59 designates an output buffer for the data bus 5.

Next, the operation will be described.

The flip-flop 60 consisting of the NOR gates 56 and 57 in the erasing error flag register 12 normally outputs "1", and the inverter 58 outputs "0". When the erasing error signal 43 output from the flash control circuit 4 becomes "1" due to the error during the erasure of the flash memory 3, the flip-flop changes state, and the output of the inverter 58 rises to "1".

On the other hand, when the CPU 2 reads the value of the erasing error flag register 12, the flip-flop is reset to its initial state, and the output of the inverter 58 falls to "0" because the one-shot pulse output from the pulse generator 55 is input to the NOR gate 56.

Although the CPU 2 suspends its operation after the issue of the erasure command because the clock is suspended as in embodiment 1, it restarts its operation after the end of the erasure operation because the clock signal is resupplied regardless of the normal completion or abnormal completion of the erasure operation.

Since the CPU 2 can recognize whether the erasure of the flash memory 3 has been completed normally or abnormally by reading the value in the erasing error flag register 12 after restarting its operation, it can carry out suitable processing after the restart.

Although the flip-flop 60 is reset when the CPU 2 reads the erasing error flag register 12 in this embodiment, it can be reset by the rising edge of the write/erasure busy signal 42 output from the flash control circuit 4. In this case, as shown by the broken line in FIG. 5, the write/erasure busy signal 42 output from the write/erasure busy signal 42 is supplied to the pulse generator 55 so that the one-shot pulse is generated by the rising edge of the write/erasure busy signal 42.

According to the present embodiment 4, since the CPU 2 can recognize whether the erasure operation has been completed normally or abnormally by reading the value of the erasing error flag register 12 after the CPU 2 restarts its operation, it can detect the erasing error such as an overtime of the erasure. Accordingly, the CPU 2 can take appropriate action in subsequent processing.

EMBODIMENT 5

Figure 6:
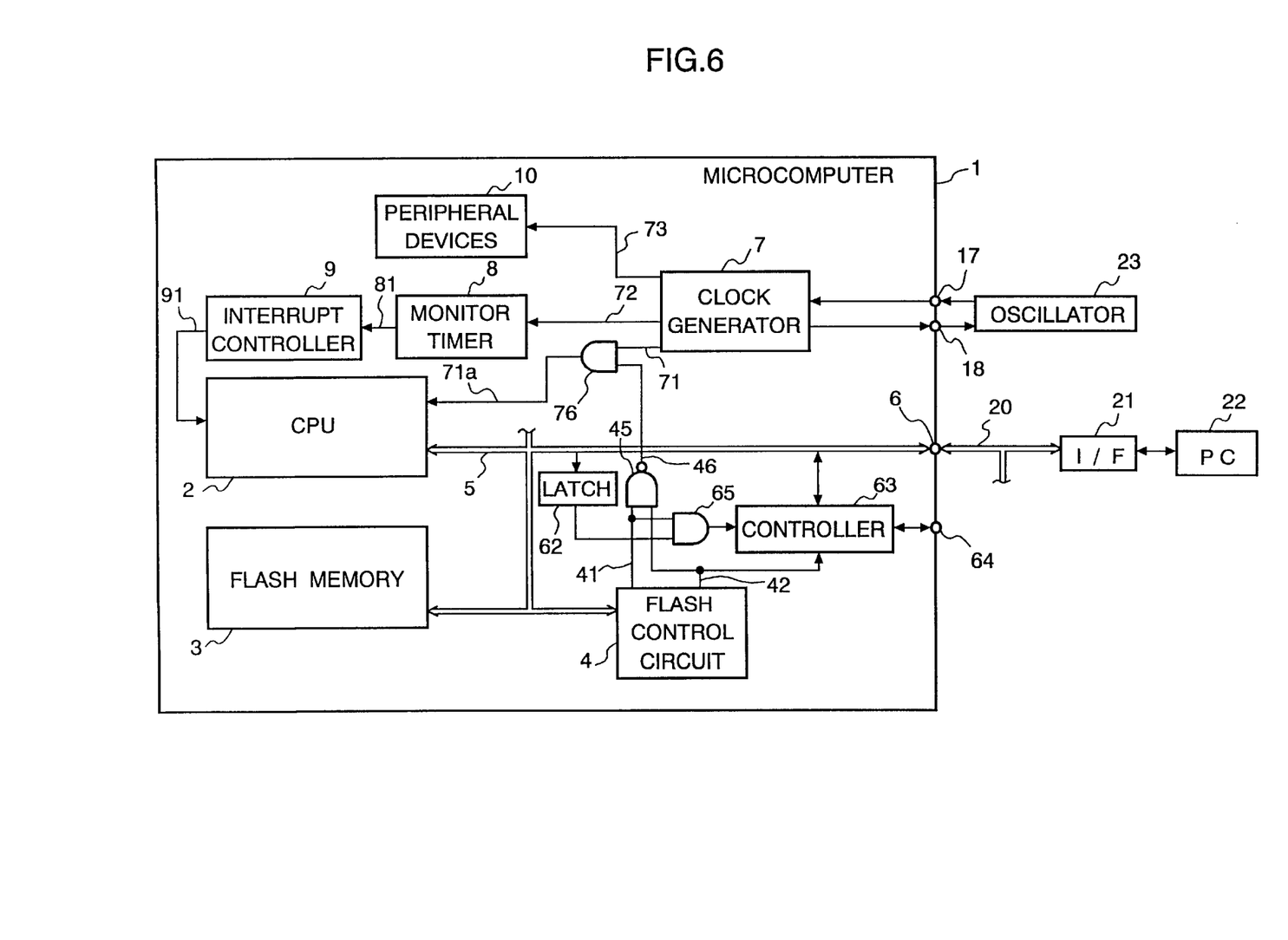
FIG. 6 is a block diagram showing an embodiment 5 of the microcomputer with a built-in flash memory in accordance with the present invention.

FIG. 6 is a block diagram showing an embodiment 5 of the microcomputer with a built-in flash memory in accordance with the present embodiment. In this figure, the same or like portions to those of FIG. 1 are designated by the same reference numerals and the description thereof is omitted here.

The reference numeral 62 designates a busy bit output enable bit holding latch (busy signal output enable bit holding means), 64 designates a test and input/output port functioning as a general purpose input/output port after a test, 63 designates a port input/output controller for controlling the input and output of the test and input/output port 64, and 65 designates an AND gate for ANDing the CPU rewrite mode designating signal 41 output from the flash control circuit 4 and the value held by the busy signal output enable bit holding latch 62.

Next, the operation of the present embodiment will be described.

The test and input/output port 64 is controlled by the port input/output controller 63 such that when the output of the AND gate 65 is "0", it is used as the normal input/output port connected to the data bus 5 under the control of the CPU 2, and when the output of the AND gate 65 is "1", it outputs the write/erasure busy signal 42 which is output from the flash control circuit 4.

Since the port input/output controller 63 operates in this way, setting "1" in the busy signal output enable bit holding latch 62 at the shipment of the microcomputer 1 enables the control state of the flash memory 3 to be detected by reading the state of the test and input/output port 64 with a tester. Specifically, it can be identified that the flash memory 3 is under writing or erasure when the test and input/output port 64 is "1" because the write/erasure busy signal 42 is active in this case, and that the flash memory 3 is not under writing or erasure when the test and input/output port 64 is "0" because the port 64 enables the control state of the flash memory 3 to be identified. This makes it possible to establish the timing of operations such as supplying of the input data, or checking of the output data.

According to embodiment 5, since the control state of the flash memory 3 can be identified by reading the state of the test and input/output port 64, it is possible to establish synchronization between the tester and the microcomputer 1, even if the CPU 2 automatically suspends its operation during the writing or erasure of the flash memory 3, and then automatically restarts its operation after the writing or erasure. In addition, since the test and input/output port 64 functions as a general purpose input/output port after it has been used by the tester, a port dedicated to the test, which is unnecessary for common users, is not required.

Although the foregoing embodiments 4 and 5 are described as variations of embodiment 1, embodiments 2 and 3 can be modified in the same manner.

What is claimed is:

1. A microcomputer with a built-in flash memory comprising:

clock generating means for generating a clock signal;

a central processing unit (CPU) operating in accordance with the clock signal;

a flash control circuit for writing and erasing of said flash memory in response to a respective write command and erase command issued by said CPU; and CPU clock control means for suspending, in response to a signal output from said flash control circuit, supply of the clock signal from said clock generating means to said CPU during writing and erasing of said flash memory, wherein said CPU clock control means comprises a NAND sate which NANDs a CPU rewrite mode designating signal and a write/erasure busy signal, both output from said flash control circuit and kept "1" during writing and erasing of said flash memory, and an AND gate which ANDs the clock signal and an output of said NAND gate.

2. The microcomputer as claimed in claim 1, comprising an erasing error flag register set by an erasing error signal output from said flash control circuit when an error occurs while erasing said flash memory.

3. The microcomputer as claimed in claim 1, comprising:

busy signal output enable bit holding means for holding a bit that determines whether to output a state of said flash control circuit;

a test and input/output port used as a test port and a general purpose input/output port, said test port outputting the state of said flash control circuit; and a port input/output control circuit for controlling said test and input/output port such that said test and input/output port is used as the test port if the bit held in said busy signal output enable bit holding means is an enable bit, and is used as the general purpose input/output port if the bit is not an enable bit.

4. The microcomputer as claimed in claim 2, comprising:

busy signal output enable bit holding means for holding a bit that determines whether to output a state of said flash control circuit;

a test and input/output port used as a test port and a general purpose input/output port, said test port outputting the state of said flash control circuit; and a port input/output control circuit for controlling said test and input/output port such that said test and input/ output port is used as the test port if the bit held in said busy signal output enable bit holding means is an enable bit, and is used as the general purpose input/output port if the bit is not an enable bit.

5. A microcomputer with a built-in flash memory comprising:

clock generating means for generating a clock signal;

a central processing unit (CPU) operating in accordance with the clock signal;

a flash control circuit for writing and erasing of said flash memory in response to a respective write command and erase command issued by said CPU;

a monitor timer, operating in response to the clock signal, for preventing said CPU from running out of control by producing an interrupt;

monitor timer clock control means for suspending, in response to a signal output from said flash control circuit, supply of the clock signal from said clock generating means to said monitor timer during writing and erasing of said flash memory;

busy signal output enable bit holding means for holding a bit that determines whether to output a state of said flash control circuit;

a test and input/output sort used as a test port and as a general purpose input/output sort, said test and input/output port outputting the state of said flash control circuit; and a port input/output control circuit for controlling said test and input/output port such that said test and input/output port is used as the test port if the bit held in said busy signal output enable bit holding means is an enable bit, and is used as the general purpose input/output port if the bit is not an enable bit.

6. The microcomputer as claimed in claim 3, comprising an erasing error flag register set by an erasing error signal output from said flash control circuit when an error occurs while erasing said flash memory.

7. The microcomputer as claimed in claim 5, wherein said CPU clock control means comprises a NAND gate which NANDs a CPU rewrite mode designating signal and a write/erasure busy signal, both output from said flash control circuit and kept "1" during writing and erasing of said flash memory, and an AND gate which ANDs the clock signal and an output of said NAND gate.

8. A microcomputer with a built-in flash memory comprising:

clock generating means for generating a clock signal;

a central processing unit (CPU) operating in accordance with the clock signal;

a monitor timer, operating in response to the clock signal, for preventing said CPU from running out of control by producing an interrupt;

a flash control circuit for writing and erasing of said flash memory in response to a respective write command and erase command issued by said CPU;

CPU clock control means for suspending, in response to a signal output from said flash control circuit, supply of the clock signal from said clock generating means to said CPU during writing and erasing of said flash memory, wherein said CPU clock control means comprises a NAND gate which NANDs a CPU rewrite mode designating signal and a write/erasure busy signal, both output from said flash control circuit and kept "1" during writing and erasing of said flash memory, and an AND gate which ANDs said clock signal and an output of the NAND gate; and monitor timer clock control means for suspending, in response to a signal output from said flash control circuit, supply of the clock signal from said clock generating means to said monitor timer during writing and erasing of said flash memory.

9. The microcomputer as claimed in claim 8, comprising an erasing error flag register set by an erasing error signal output from said flash control circuit when an error occurs while erasing said flash memory.

10. The microcomputer as claimed in claim 8, comprising:

busy signal output enable bit holding means for holding a bit that determines whether to output a state of said flash control circuit;

a test and input/output port used as a test port and a general purpose input/output port, said test port outputting the state of said flash control circuit; and a port input/output control circuit for controlling said test and input/output port such that said test and input/output port is used as the test port if the bit held in said busy signal output enable bit holding means is an enable bit, and is used as the general purpose input/output port if the bit is not an enable bit.

11. The microcomputer as claimed in claim 9, comprising:

busy signal output enable bit holding means for holding a bit that determines whether to output a state of said flash control circuit or not;

a test and input/output port used as a test port and a general purpose input/output port, said test port outputting the state of said flash control circuit; and a port input/output control circuit for controlling said test and input/output port such that said test and input/output port is used as the test port if the bit held in said busy signal output enable bit holding means is an enable bit, and is used as the general purpose input/output port if the bit is not an enable bit.

* * * * *

UNITED STATES PATENT AND TRADEMARK OFFICE
CERTIFICATE OF CORRECTION

PATENT NO. : 5,923,838
DATED : 7/13/99
INVENTOR(S) : Hongo

It is certified that error appears in the above-identified patent and that said Letters Patent is hereby corrected as shown below:

Column 10, line 35, delete "sate" and insert --circuit--

Column 10, line 38, delete "1" and insert --at an active level--

Column 10, line 39, delete "gate" and insert --circuit--

Column 10, line 40, delete "gate" and insert --circuit--

Column 11, line 41, delete "gate" and insert --circuit--

Column 11, line 44, delete "1" and insert --at an active level--

Column 11, line 45, delete "gate" and insert --circuit--

Column 11, line 46, delete "gate" and insert --circuit--

Column 12, line 10, delete "gate" and insert --circuit--

Column 12, line 13, delete "1" and insert --at an active level--

UNITED STATES PATENT AND TRADEMARK OFFICE
CERTIFICATE OF CORRECTION

PATENT NO. : 5,923,838
DATED : 7/13/99
INVENTOR(S) : Hongo

It is certified that error appears in the above-identified patent and that said Letters Patent is hereby corrected as shown below:

Column 12, line 14, delete "gate" and insert --circuit--

Column 12, line 15, delete "gate" and insert --circuit--.

Signed and Sealed this

Fourteenth Day of September, 1999

Attest:

Q. TODD DICKINSON

Attesting Officer

Acting Commissioner of Patents and Trademarks